(12) United States Patent
Yu et al.

(10) Patent No.: US 10,347,575 B2
(45) Date of Patent: Jul. 9, 2019

(54) PACKAGE SUBSTRATE AND ITS FABRICATION METHOD

(71) Applicant: PHOENIX PIONEER TECHNOLOGY CO., LTD., Hsinchu County (TW)

(72) Inventors: Chun-Hsien Yu, Hsinchu County (TW); Shih-Ping Hsu, Hsinchu County (TW); Pao-Hung Chou, Hsinchu County (TW); Chi-Feng Peng, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 15/227,350

(22) Filed: Aug. 3, 2016

(65) Prior Publication Data
US 2017/0047278 A1    Feb. 16, 2017

(30) Foreign Application Priority Data
Aug. 14, 2015    (TW) .............................. 104126587 A

(51) Int. Cl.
| | |
|---|---|
| *H05K 3/40* | (2006.01) |
| *H05K 3/46* | (2006.01) |
| *H01L 21/02* | (2006.01) |
| *H01L 23/28* | (2006.01) |
| *H01L 23/498* | (2006.01) |
| *H01L 21/683* | (2006.01) |
| *H01L 21/48* | (2006.01) |

(52) U.S. Cl.
CPC ...... *H01L 23/49838* (2013.01); *H01L 21/486* (2013.01); *H01L 21/4857* (2013.01); *H01L 21/6835* (2013.01); *H01L 23/49822* (2013.01); *H01L 23/49827* (2013.01); *H01L 23/49866* (2013.01); *H01L 2221/68345* (2013.01)

(58) Field of Classification Search
CPC . H05K 3/40; H05K 3/46; H01L 21/02; H01L 21/27; H01L 21/40; H01L 21/67; H01L 21/68; H01L 21/70; H01L 23/28; H01L 23/31; H01L 23/52
USPC .......... 174/257, 264; 361/712; 29/830, 852; 438/393, 618, 638; 257/737, 774, 512, 257/514, E23.124
See application file for complete search history.

(56) References Cited

U.S. PATENT DOCUMENTS

| | | | | |
|---|---|---|---|---|
| 4,954,875 | A | * | 9/1990 | Clements .......... H01L 21/76898 257/686 |
| 5,691,238 | A | * | 11/1997 | Avanzino .......... H01L 21/76807 257/E21.579 |
| 5,946,600 | A | * | 8/1999 | Hurwitz .............. H01L 21/4846 257/E21.589 |
| 6,037,244 | A | * | 3/2000 | Gardner ............ H01L 21/76895 257/E21.579 |

(Continued)

*Primary Examiner* — Xiaoliang Chen
(74) *Attorney, Agent, or Firm* — WPAT, PC

(57) ABSTRACT

This disclosure provides a package substrate and its fabrication method. The package substrate comprises: a first dielectric material layer have an opening; a first conductive unit including a first part in the opening of the first dielectric material layer and a second part on the first dielectric material layer; and a second dielectric material layer covering the first conductive unit and the first dielectric material layer; wherein a height of the first conductive unit is larger than a thickness of the first dielectric material layer; wherein a cross-section of the second part is larger than that of the first part in the first conductive unit.

6 Claims, 4 Drawing Sheets

(56) References Cited

U.S. PATENT DOCUMENTS

| | | | | |
|---|---|---|---|---|
| 6,127,835 A * | 10/2000 | Kocher | ............ | G01R 1/07378 |
| | | | | 324/750.25 |
| 6,175,243 B1 * | 1/2001 | Kocher | ............ | G01R 1/07378 |
| | | | | 324/750.25 |
| 6,262,478 B1 * | 7/2001 | Hurwitz | ............ | H01L 21/76885 |
| | | | | 257/700 |
| 6,353,189 B1 * | 3/2002 | Shimada | ............ | H01L 21/563 |
| | | | | 174/255 |
| 6,800,551 B2 * | 10/2004 | Nagahara | ............ | G03F 7/0045 |
| | | | | 257/E21.027 |
| 6,822,329 B2 * | 11/2004 | Varrot | ............ | H01L 24/03 |
| | | | | 257/508 |
| 2001/0023532 A1 * | 9/2001 | Fujii | ............ | H01L 21/4857 |
| | | | | 29/830 |
| 2004/0104042 A1 * | 6/2004 | Takase | ............ | H05K 3/0038 |
| | | | | 174/255 |
| 2005/0155792 A1 * | 7/2005 | Ito | ............ | H05K 3/4069 |
| | | | | 174/264 |
| 2008/0107863 A1 * | 5/2008 | Ikeda | ............ | H01L 21/4857 |
| | | | | 428/137 |
| 2012/0049345 A1 * | 3/2012 | Railkar | ............ | H01L 23/3677 |
| | | | | 257/737 |
| 2013/0093004 A1 * | 4/2013 | Takaishi | ............ | H01L 29/66666 |
| | | | | 257/329 |
| 2013/0114212 A1 * | 5/2013 | Tada | ............ | H01B 1/02 |
| | | | | 361/712 |
| 2013/0319737 A1 * | 12/2013 | Hurwitz | ............ | H01L 23/3677 |
| | | | | 174/257 |
| 2014/0174793 A1 * | 6/2014 | Oh | ............ | H05K 1/0206 |
| | | | | 174/252 |
| 2015/0037960 A1 * | 2/2015 | Chang | ............ | H01L 21/02 |
| | | | | 438/393 |

* cited by examiner

PACKAGE SUBSTRATE AND ITS
FABRICATION METHOD

CROSS REFERENCE TO RELATED APPLICATION

This application claims the benefit of Taiwan application Serial No. 104126587, filed Aug. 14, 2015, the disclosure of which is incorporated by reference herein in its entirety.

FIELD OF THE INVENTION

The present invention relates to a wire structure, a package substrate including the wire structure, and their fabrication methods.

BACKGROUND OF THE INVENTION

As recent rapid trend in modern electronic devices is not only toward thinner, lighter and smaller devices, but also toward multifunctional and high-performance devices, the fabrication and technology of integrated circuits (ICs) has to evolve correspondingly toward a more high-density and miniature design so as to allow more electronic components to be received inside limited chip space. Consequently, the relating IC package substrate and the package technology are evolved accordingly to meet the trend.

To realize a package substrate with high-density circuit wires, the wires must be designed in a fine-pitch manner and often fabricated by the so-called "semi-additive process". Whereby, the wire width and the wire separation between two adjacent wires are almost the same, for example, a width of 15 or 20 µm and a separation of 15 or 20 µm. As for such fine-pitch circuit wires, the wire thickness is usually at most 20 µm.

In the applications of high-power electronic product, the circuit wire should be thickened if possible to increase its cross-sectional area and hence its electrical conductivity. However, it is difficult to thicken wires in a fine-pitch circuit because that would lower fabrication yield and product reliability. Therefore it is in need of a new and advanced packaging solution.

SUMMARY OF THE INVENTION

According to one aspect of the present disclosure, one embodiment provides a package substrate, which comprises: a first dielectric material layer have an opening; a first conductive unit including a first part in the opening of the first dielectric material layer and a second part on the first dielectric material layer; and a second dielectric material layer covering the first conductive unit and the first dielectric material layer; wherein a height of the first conductive unit is larger than a thickness of the first dielectric material layer; wherein a cross-section of the second part is larger than that of the first part in the first conductive unit.

In one embodiment, the first conductive unit may comprise at least one of Cu, Ni, Sn and Au.

In one embodiment, the package substrate may further comprise: a third dielectric material layer formed on the second dielectric material; and a second conductive unit formed on the first conductive unit; wherein an interface area between the first conductive unit and the second conductive unit is smaller than a cross-section of the second conductive unit.

In one embodiment, the package substrate may further comprises: a fourth dielectric material layer formed on the third dielectric material; and a third conductive unit formed on the second conductive unit; wherein an interface area between the second conductive unit and the third conductive unit is smaller than a cross-section of the third conductive unit.

According to another aspect of the present disclosure, another embodiment provides a method for fabricating a package structure, comprising the steps of: providing a carrier; forming a first dielectric material layer on the carrier; patterning the first dielectric material layer, so that an opening is formed in the first dielectric material layer to expose the carrier; and forming a first conductive unit on the carrier, so that a height of the first conductive unit is larger than a thickness of the first dielectric material layer, and a width of the first conductive unit on the first dielectric material layer is larger than that of the opening.

In one embodiment, the method may further comprise: forming a second dielectric material layer on the first conductive unit; partly removing the second dielectric material layer and the first conductive unit, so that the first conductive unit is exposed; and forming a second conductive unit on the first conductive unit.

In one embodiment, the method may further comprise: forming a third dielectric material layer on the second conductive unit; and removing the carrier.

In one embodiment, the method may further comprise: removing the first dielectric material layer and a part of the first conductive unit.

In one embodiment, the first conductive unit is formed by electroplating.

In one embodiment, the first conductive unit comprises at least one of Cu, Ni, Sn and Au, and the second conductive unit comprises at least one of Cu, Ni, Sn and Au.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

In the following embodiments of the present disclosure, when an element is described to be disposed above/mounted on top of or below/under another element, it comprises either the element is directly or indirectly disposed above/below the other element, i.e. when indirectly, there can be some other element arranged between the two; and when directly, there is no other element disposed between the two. It is noted that the descriptions in the present disclosure relate to "above" or "below" are based upon the related diagrams provided, but are not limited thereby. Moreover, the terms "first", "second", and "third", and so on, are simply used for clearly identifying different elements of the same nature, but those elements are not restricted thereby and must be positioned or arranged accordingly. In addition, the size or thickness of each and every element provided in the following diagrams of the present disclosure is only schematic representation used for illustration and may not represent its actual size.

Figure 1:
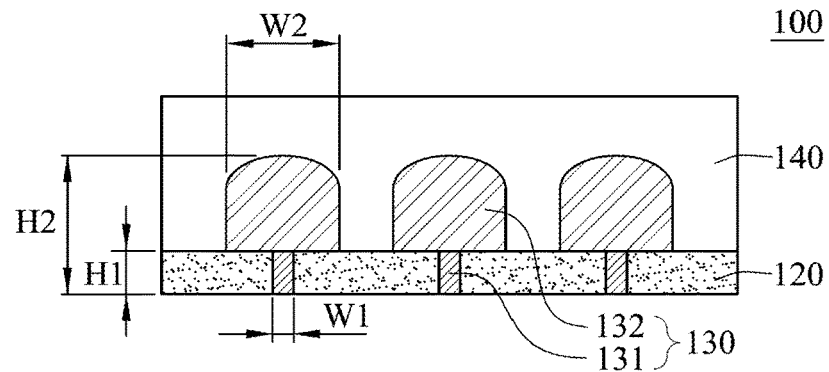
FIG. 1 is a cross-sectional view of a package substrate according to a first embodiment of the present invention.

FIG. 1 is a cross-sectional view of a package substrate 100 according to a first embodiment of the present invention. The package substrate 100 comprises: a first dielectric material layer 120, at least one first conductive unit 130, and a second dielectric material layer 140. The first dielectric material layer 120 has an opening for defining the location where the first conductive unit 130 is to be formed. The at least one first conductive unit 130 represents metal wires of the circuit layout or the redistribution layer (RDL) of the package substrate 100. As shown in FIG. 1, three first conductive units 130 in the embodiment; however, the quantity of the first conductive units 130 is not limited thereto but depends on practical requirements of the circuit layout of the package substrate 100. The first conductive unit 130 can be divided into two parts: a first part 131 filling up the opening of the first dielectric material layer 120, and a second part 132 disposed on the first part 131 and extending outwards on the first dielectric material layer 120. The second dielectric material layer 140 covers the first conductive unit 130 and the first dielectric material layer 120, so as to protect the package substrate 100 from being damaged by external objects or the subsequent fabrication process like soldering.

The first dielectric material layer 120 can be photo-sensitive or non-photo-sensitive. If the first dielectric material layer 120 is formed of photo-sensitive material like a photo-resist, the opening can be formed by means of photolithography. On the other respect, if the first dielectric material layer 120 is formed of non-photo-sensitive material, the opening can be formed by means of laser ablation. The thickness of the first dielectric material layer 120 is labeled as $H_1$ and the width of the opening is labeled as $W_1$, as shown in FIG. 1. Because of the opening, the first dielectric material layer 120 is used to define the formation and location of the first conductive unit 130. For example, the first conductive unit 130 can be formed on the opening by electrolytic plating, and the first dielectric material layer 120 can be used as a plating-resist layer to prevent electrolytic plating outside the opening.

The first conductive unit 130 can be made of Cu, Ni, Sn, Au, or the combination thereof by electrolytic plating or metal evaporation. As shown in FIG. 1, the height of the first conductive unit 130 is labeled as $H_2$ and the width of the second part 132 of the first conductive unit 130 is labeled as $W_2$. In the embodiment, $H_2$ is larger than $H_1$ and the cross-section (e.g. $W_2$) of the second part 132 is larger than the cross-section (e.g. $W_1$) of the first part 131 of the first conductive unit 130. To meet such requirements, appropriate conditions of electrolytic plating can be set so that the plated metal grows and eventually overflows the opening onto the first dielectric material layer 120 (the plating-resist layer). The first part 131 means the part of the first conductive unit 130 in the opening, while the second part 132 means the other part of the first conductive unit 130 which extends upwards and outwards on the first part 131. The first conductive units 130 acts as metal wires of the circuit layout of the package substrate 100, and their width $W_2$ depends on the width $W_1$ of the opening and the plating conditions of the first conductive unit 130.

The second dielectric material layer 140 covers the first conductive unit 130 and the first dielectric material layer 120 to be the outermost part of the package substrate 100. So the second dielectric material layer 140 can protect the package substrate 100 from being damaged by external objects or the subsequent fabrication process like soldering. In the embodiments, the package substrate 100 can be a flip-chip chip size package (FCCSP) substrate used to construct the molded interconnection substrate (MIS).

Figure 2:
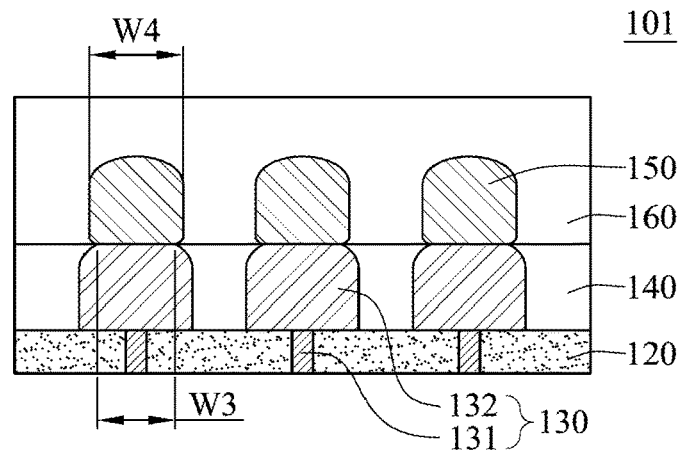
FIG. 2 is a cross-sectional view of a package substrate according to a second embodiment.

To increase the cross-section of a metal wire in the circuit layout of the package substrate 100, the metal wire can be of multi-layer stacked structure. FIG. 2 schematically shows a cross-sectional view of a package substrate 101 according to a second embodiment. Compared with the package substrate 100 in FIG. 1, the package substrate 101 further includes a second conductive unit 150 and a third dielectric material layer 160, after the upper part of the package substrate 100 is partly removed. It can be performed by polishing or grinding to remove the upper part of the package substrate 100 in a top-down manner until a flat top face of the first conductive unit 130 is exposed out of the covering of the second dielectric material layer 140, as shown in FIG. 2. The second conductive unit 150 is then formed and hence stacked on the flat top face of the first conductive unit 130. In the embodiment, the first conductive unit 130 and the second conductive unit 150 are combined to be an individual metal wire in the circuit layout of the package substrate 101. The second conductive unit 150 can be made of the same or different material from the first conductive unit 130. The third dielectric material layer 160 is then formed on the second dielectric material 140 to cover the second conductive unit 150, to be the outermost part of the package substrate 101. So the third dielectric material layer 160 can protect the package substrate 101 from being damaged by external objects or the subsequent fabrication process. The third dielectric material layer 160 can be made of the same or different material from the second dielectric material layer 140. In the embodiment, the interface area (e.g. the width $W_3$) between the first conductive unit 130 and the second conductive unit 150 is smaller than a cross-section (e.g. the width $W_4$) of the second conductive unit 150. Wherein, the interface area means the contact area between the first conductive unit 130 and the second conductive unit 150 at the interface.

Figure 3:
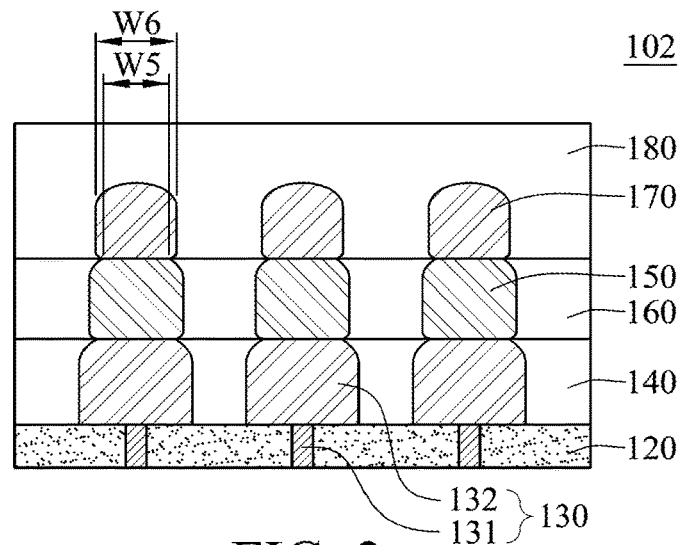
FIG. 3 is a cross-sectional view of a package substrate according to a third embodiment.

FIG. 3 schematically shows a cross-sectional view of a package substrate 102 according to a third embodiment. Compared with the package substrate 101 in FIG. 2, the package substrate 102 further includes a third conductive unit 170 and a fourth dielectric material layer 180, after the upper part of the package substrate 101 is partly removed. It can be performed by polishing or grinding to remove the upper part of the package substrate 101 in a top-down manner until a flat top face of the second conductive unit 150 is exposed out of the covering of the third dielectric material layer 160, as shown in FIG. 3. The third conductive unit 170 is then formed and hence stacked on the flat top face of the second conductive unit 150. In the embodiment, the first conductive unit 130, the second conductive unit 150 and the third conductive unit 170 are combined to be an individual metal wire in the circuit layout of the package substrate 102. The third conductive unit 170 can be made of the same or different material from the first conductive unit 130. The fourth dielectric material layer 180 is then formed on the third dielectric material layer 160 to cover the third conductive unit 170, to be the outermost part of the package substrate 102. So the fourth dielectric material layer 180 can protect the package substrate 102 from being damaged by external objects or the subsequent fabrication process. The fourth dielectric material layer 180 can be made of the same or different material from the second dielectric material layer 140. In the embodiment, the interface area (e.g. the width $W_5$) between the second conductive unit 150 and the third conductive unit 170 is smaller than a cross-section (e.g. the width $W_6$) of the third conductive unit 170.

Furthermore, the package substrate 101 of the second embodiment as shown in FIG. 2 can be modified according to different purposes to the following embodiments.

Figure 4:
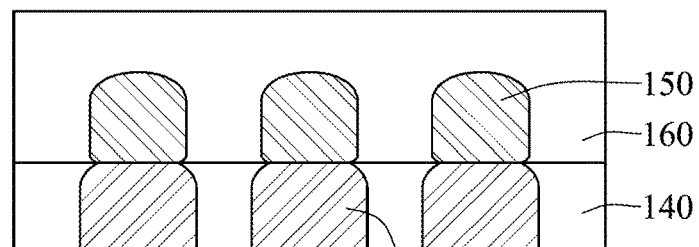
FIG. 4 is a cross-sectional view of a package substrate according to a fourth embodiment.

FIG. 4 schematically shows a cross-sectional view of a package substrate 201 according to a fourth embodiment. Compared with the package substrate 101 in FIG. 2, the package substrate 201 is formed by removing the first dielectric material layer 120 and the first part 131 of the first conductive unit 130.

Figure 5:
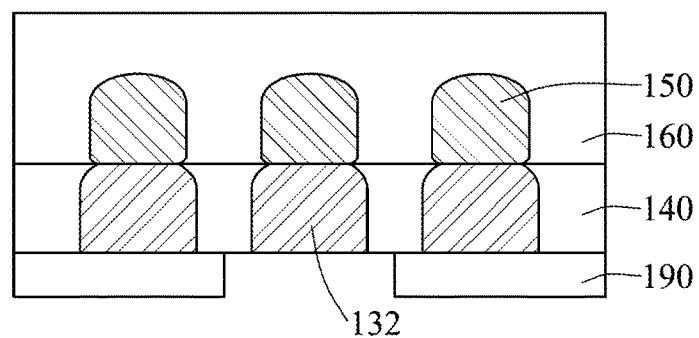
FIG. 5 is a cross-sectional view of a package substrate according to a fifth embodiment.

FIG. 5 schematically shows a cross-sectional view of a package substrate 301 according to a fifth embodiment. Compared with the package substrate 201 in FIG. 4, the package substrate 301 further includes a fifth dielectric material layer 190 below the second dielectric material layer 140. The fifth dielectric material layer 190 covers the right and left ones of the second parts 132 of the first conductive units 130 while does not cover the middle one. The fifth dielectric material layer 190 can be made of the same or different material from the second dielectric material layer 140.

Figure 6:
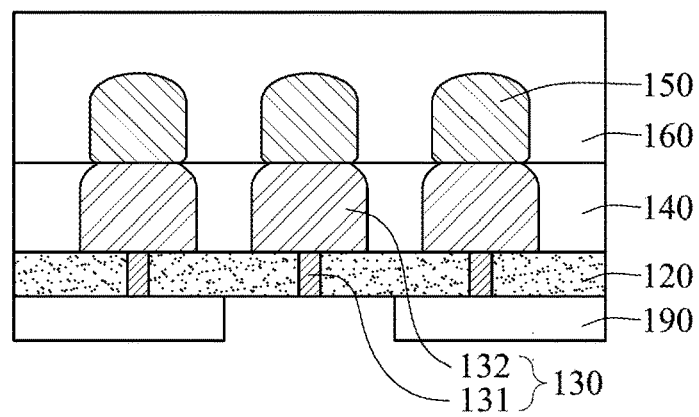
FIG. 6 is a cross-sectional view of a package substrate according to a sixth embodiment.

FIG. 6 schematically shows a cross-sectional view of a package substrate 401 according to a sixth embodiment. Compared with the package substrate 101 in FIG. 2, the package substrate 401 further includes a fifth dielectric material layer 190 below the first dielectric material layer 120. The fifth dielectric material layer 190 covers the right and left ones of the first parts 131 of the first conductive units 130 while does not cover the middle one. The fifth dielectric material layer 190 can be made of the same or different material from the first dielectric material layer 120.

The fabrication methods of the embodiments are provided below. FIG. 7-10 and FIG. 1 are sectional views of the package substrate 100 in different steps of the fabrication method according to the first embodiment.

Figure 7:
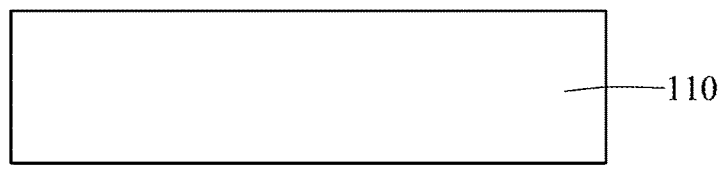
FIG. 7-10 are sectional views of the package substrate in different steps of the fabrication method according to the first embodiment.
Figure 8:
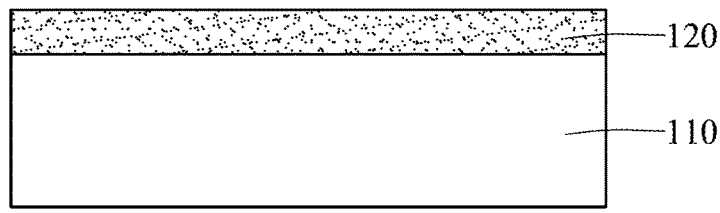

At first, a carrier substrate 110 is provided, as shown in FIG. 7, for supporting the package substrate 100 in the subsequent fabrication process. The carrier substrate 110 can be a metal plate or a metal-coated dielectric plate. The aforesaid metal can be Fe, Cu, Ni, Sn, Al, Au, or the combination or alloy thereof, but is not limited thereby.

Next, a first dielectric material layer 120 is formed on the carrier substrate 110. The first dielectric material layer 120 can be photo-sensitive or non-photo-sensitive, to be used to form the first conductive unit 130.

Figure 9:
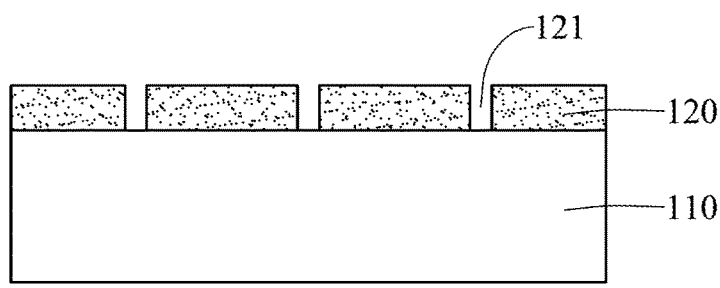

Next, the first dielectric material layer 120 is patterned so that openings 121 are formed in the first dielectric material layer 120 to expose the carrier substrate 110, as shown in FIG. 9. The openings 121 are arranged to define the location where the first conductive unit 130 is to be formed. If the first dielectric material layer 120 is formed of photo-sensitive material like a photo-resist, the opening can be formed by means of photolithography. On the other respect, if the first dielectric material layer 120 is formed of non-photo-sensitive material, the opening can be formed by means of laser ablation.

Figure 10:
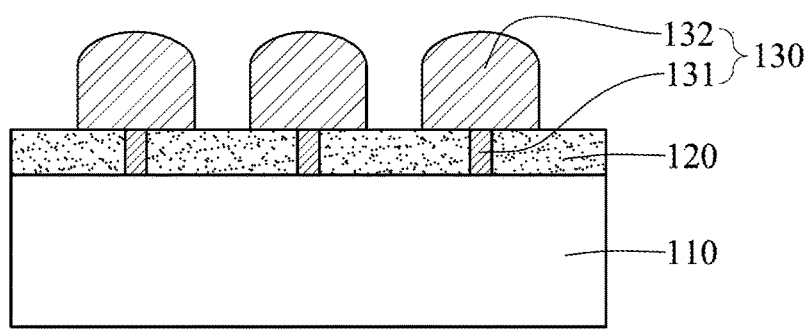

Next, a first conductive unit 130 is formed on the carrier substrate 110 as shown in FIG. 10. Referring to FIG. 1, the height $H_2$ of the first conductive unit 130 is larger than the thickness $H_1$ of the first dielectric material layer 120, and the width $W_2$ of the first conductive unit 130 on the first dielectric material layer 120 is larger than the width $W_1$ of the opening 121. The first conductive unit 130 can be made of Cu, Ni, Sn, Au, or the combination thereof by electrolytic plating or metal evaporation. For example, the first conductive unit 130 can be formed on the opening 121 by electrolytic plating, and the first dielectric material layer 120 can be used as a plating-resist layer to prevent electrolytic plating outside the opening 121.

To meet the above dimensional requirements, appropriate conditions of electrolytic plating can be set so that the plated metal grows to be the first part 131 of the first conductive unit 130. The plated metal will continue growing and eventually overflows the opening 121 onto the first dielectric material layer 120 to be the second part 132. The first part 131 means the part of the first conductive unit 130 in the opening 121, while the second part 132 means the other part of the first conductive unit 130 which extends upwards and outwards on the first part 131. The first conductive units 130 acts as metal wires of the circuit layout of the package substrate 100, and their width $W_2$ depends on the width $W_1$ of the opening 121 and the plating conditions of the plated metal.

Next, a second dielectric material layer 140 is formed on the first conductive unit 130, as shown in FIG. 1. The second dielectric material layer 140 covers the first conductive unit 130 and the first dielectric material layer 120 to be the outermost part of the package substrate 100. So the second dielectric material layer 140 can protect the package substrate 100 from being damaged by external objects or the subsequent fabrication process like soldering. So far, the fabrication process for the package substrate 100 of the first embodiment has been completed, after the removal of the carrier substrate 110. Wherein, the height of the first conductive unit 130 is labeled as $H_2$ and the width of the second part 132 of the first conductive unit 130 is labeled as $W_2$. In the embodiment, $H_2$ is larger than $H_1$ and the cross-section (e.g. $W_2$) of the second part 132 is larger than the cross-section (e.g. $W_1$) of the first part 131 of the first conductive unit 130.

Figure 11:
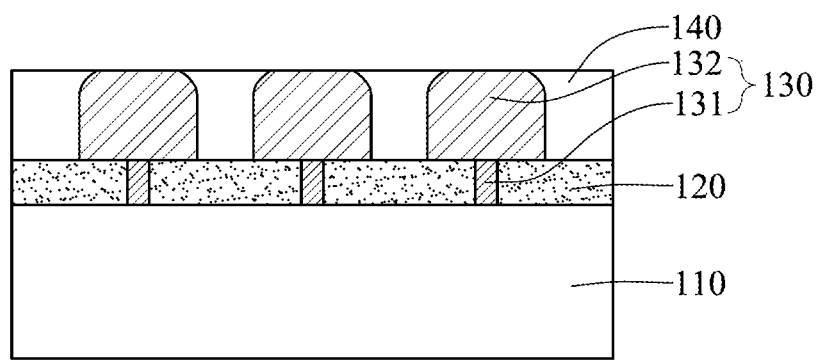
FIG. 11-12 are sectional views of the package substrate in different steps of the fabrication method according to another embodiment.

To increase the cross-section of a metal wire in the circuit layout of the package substrate 100, the metal wire can be of multi-layer stacked structure. As shown in FIG. 11, the second dielectric material layer 140 and the first conductive unit 130 can be partly removed, so that the first conductive unit 130 is exposed. It can be performed by polishing or grinding to remove the second dielectric material layer 140 in a top-down manner until a flat top face of the first conductive unit 130 is exposed out of the covering of the second dielectric material layer 140.

Figure 12:
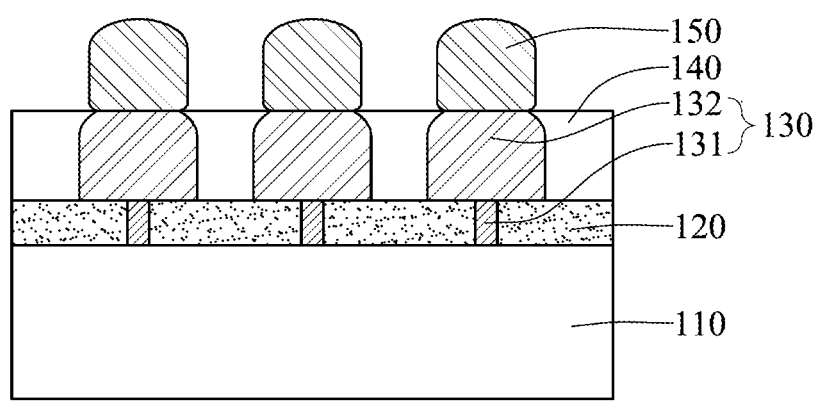

Next, a second conductive unit 150 can be formed on the first conductive unit 130 by electrolytic plating, as shown in FIG. 12. The plated metal grows only on the flat top face of the first conductive unit 130, and then the first conductive unit 130 and the second conductive unit 150 are combined to be an individual metal wire in the circuit layout of the package substrate 101. The second conductive unit 150 can be made of the same or different material from the first conductive unit 130.

Next, a third dielectric material layer 160 can be formed on the second conductive unit 150 to be the package substrate 101 as shown in FIG. 2. The third dielectric material layer 160 covers the second dielectric material 140 and the second conductive unit 150 to be the outermost part of the package substrate 101. So it can protect the package substrate 101 from being damaged by external objects or the subsequent fabrication process. The third dielectric material layer 160 can be made of the same or different material from the second dielectric material layer 140. In the embodiment, the interface area (e.g. the width $W_3$) between the first conductive unit 130 and the second conductive unit 150 is smaller than a cross-section (e.g. the width $W_4$) of the second conductive unit 150.

So far, the metal wires with a two-layer stacked structure have been obtained, and the steps as shown in FIGS. 11 and 12 can be repeated to form three-layer stacked metal wires.

Furthermore, the package substrate 101 of FIG. 2 can be modified according to different purposes to be the package substrate 201 of FIG. 4, the package substrate 301 of FIG. 5, or the package substrate 401 of FIG. 6, by removing the first dielectric material layer 120 and the first part 131 of the first conductive unit 130.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A package substrate comprising:
a first dielectric material layer, comprising an opening, said opening defining a wire of a circuit layout of said package substrate, wherein said opening has a first width, wherein said opening is a trench;
said wire, comprising:
a lower part, disposed in and aligned along the opening; and
an upper part, disposed on the first dielectric material layer and aligned along said lower part, wherein said upper part has a second width greater than said first width;
wherein the lower part and the upper part are combined to form said wire and a cross-sectional area of the upper part is larger than a cross-sectional area of the lower part, the upper part increasing the cross-sectional area and resultant electrical connectivity of the wire in the package substrate and reducing an impedance of the wire to improve telecommunication quality thereon;
a second dielectric material layer, covering the first dielectric material layer;
wherein said wire is a trace of said circuit layout on said first dielectric material layer; and
a third dielectric material layer, formed on the second dielectric material, wherein said wire further comprises a third part, formed on and aligned along said upper part, a first interface area between the upper part and the third part has a third width, said third part has a fourth width, and said third width is smaller than said second width and said fourth width.

2. The package substrate of claim 1, wherein said second dielectric material layer covers said wire.

3. The package substrate of claim 1, further comprising:
a third dielectric material layer, formed on the second dielectric material,
wherein said wire further comprises a third part, formed on and aligned along said upper part, a first interface area between the upper part and the third part has a third width, said third part has a fourth width, and said third width is smaller than said second width and said fourth width.

4. The package substrate of claim 3, further comprising:
a fourth dielectric material layer, formed on the third dielectric material,
wherein said wire further comprises a fourth part, formed on and aligned along said third part, a second interface area between the third part and the fourth part has a fifth width, said fourth part has a sixth width, and said fifth width is smaller than said fourth width and said sixth width.

5. The package substrate of claim 1, further comprising:
a fourth dielectric material layer, formed on the third dielectric material,
wherein said wire further comprises a fourth part, formed on and aligned along said third part, a second interface area between the third part and the fourth part has a fifth width, said fourth part has a sixth width, and said fifth width is smaller than said fourth width and said sixth width.

6. A package substrate comprising:
a first dielectric material layer, comprising an opening, said opening defining a wire of a circuit layout of said package substrate, wherein said opening has a first width;
said wire, comprising:
a lower part, disposed in and aligned along the opening;
an upper part, disposed on the first dielectric material layer and aligned along said lower part, wherein said upper part has a second width greater than said first width;
a third part, formed on and aligned along said upper part, a first interface area between the upper part and the third part has a third width, said third part has a fourth width, and said third width is smaller than said second width and said fourth width; and
a fourth part, formed on and aligned along said third part, a second interface area between the third part and the fourth part has a fifth width, said fourth part has a sixth width, and said fifth width is smaller than said fourth width and said sixth width;
a second dielectric material layer, covering the first dielectric material layer;

a third dielectric material layer, formed on the second dielectric material; and
a fourth dielectric material layer, formed on the third dielectric material.

* * * * *